United States Patent [19]

Sato et al.

[11] Patent Number: 5,297,095
[45] Date of Patent: Mar. 22, 1994

[54] SEMICONDUCTOR NON-VOLATILE MEMORY DEVICE IMPROVED IN VERIFYING OPERATION FOR ERASED AND WRITE-IN STATES

[75] Inventors: Toshiya Sato; Kazuhisa Ninomiya, both of Tokyo, Japan

[73] Assignee: NEC Corporation, Tokyo, Japan

[21] Appl. No.: 943,003

[22] Filed: Sep. 10, 1992

[30] Foreign Application Priority Data

Sep. 10, 1991 [JP] Japan .................... 3-258411

[51] Int. Cl.$^5$ ............................ G11C 11/40
[52] U.S. Cl. .................... 365/218; 365/236; 365/185; 365/189.09; 365/189.11
[58] Field of Search .......... 365/218, 236, 185, 189.01, 365/189.11

[56] References Cited

U.S. PATENT DOCUMENTS 5,097,446  3/1992  Shoji et al. .................... 365/218

FOREIGN PATENT DOCUMENTS 2-5296  1/1990  Japan .................... 365/218

Primary Examiner—Eugene R. LaRoche
Assistant Examiner—Andrew Tran
Attorney, Agent, or Firm—Sughrue, Mion, Zinn & Macpeak & Seas

[57] ABSTRACT

When an electrically erasable and program read only memory device enters an erasing mode of operation, electrons are evacuated from floating gate electrodes of the floating gate type field effect transistors serving as memory cells, and the evacuation is continued over a time period instructed from an internal memory circuit so that the memory cells are prevented from depletion mode due to excess evacuation as well as from non-erased state due to insufficient evacuation.

5 Claims, 5 Drawing Sheets

# SEMICONDUCTOR NON-VOLATILE MEMORY DEVICE IMPROVED IN VERIFYING OPERATION FOR ERASED AND WRITE-IN STATES

FIELD OF THE INVENTION

This invention relates to a semiconductor non-volatile memory device and, more particularly, to a controlling unit for verifying erased and write-in states of memory cells.

DESCRIPTION OF THE RELATED ART

A typical example of an electrical erasable and programmable read only memory device is illustrated in FIGS. 1 and 2. FIG. 1 shows the circuit arrangement of the prior art electrically erasable and programmable read only memory device used for an erasing operation, and FIG. 2 shows the circuit arrangement used for a write-in operation.

Referring first to FIG. 1 of the drawings, a memory cell array 1 is formed by a plurality of memory cells M11, M12, M1n, Mm1, Mm2 and Mmn arranged in rows and columns, and each of the memory cells M11 through Mmn is of the n-channel floating gate type field effect transistor. The n-channel floating gate type field effect transistors are referred to with the same references as the memory cells M11 through Mmn. The structure of the n-channel floating gate type field effect transistor is well known to a person skilled in the art, and no further description is incorporated hereinbelow for the sake of simplicity. A plurality of word lines WL1 through WLm are respectively associated with the rows of the memory cell array 1, and are coupled with the control gates of the associated n-channel floating gate type field effect transistors M11 through Mmn. A plurality of digit lines D1 to Dn are associated with the columns of the memory cell array 1, and are coupled with the drain nodes of the associated n-channel floating gate type field effect transistors M11 through Mmn. A source line S is shared between all of the memory cells M11 through Mmn, and is coupled between the source nodes of the floating gate type field effect transistors M11 through Mmn and a level-shift unit 2. The digit lines D1 through Dn are further coupled with a column selector unit 3 which in turn is coupled with a data output unit 4. The column selector unit 3 has a plurality of n-channel enhancement type transfer transistors QN1, QN2 and QNn, and the n-channel enhancement type transfer transistors QN1 through QNn selectively couple the associated digit lines D1 through Dn with the data output unit 4.

The prior art electrically erasable and programmable read only memory device further comprises an instruction register 5, and an external instruction code is stored therein. The instruction register 5 is coupled with an instruction decoder/ controller unit 6, and the external instruction code is decoded at the instruction decoder/ controller unit 6. The instruction decoder/ controller unit 6 in turn is coupled with a column address decoder unit 7, a row address decoder unit 8 and a level-shift unit 9, and produces first, second, third and fourth control signals CNT1, CNT2, CNT3 and CNT4. An address signal is further supplied to the column address decoder unit 7 and the row address decoder unit 8, and the column address decoder unit 7 and the row address decoder unit 8 respectively drive decoded signal lines YS1, YS2 and YSn and the word lines WL1 through WLm. The first through third control signals will hereinbelow be described in connection with the operations of the prior art electrically erasable and programmable read only memory device.

When erasing the memory cells M11 through Mmn, electrons are concurrently evacuated from all of the floating gates of the n-channel floating gate type field effect transistors M11 through Mmn, and the threshold levels of the n-channel floating gate type field effect transistors M11 through Mmn are lowered below a read-out voltage level. Namely, an external instruction command code indicative of the erasing operation is supplied to the instruction register 5, and is decoded by the instruction decoder/ controller unit 6. The instruction decoder/ controller unit 6 produces the first and second control signals CNT1 and CNT2 indicative of disable state, and the column address decoder unit 7 and the row address decoder unit 8 ignores the address signal. In this situation, the column address decoder unit 7 causes all of the n-channel enhancement type transfer transistors QN11 through QN1n to turn off, and the row address decoder unit 8 shifts all of the word lines WL1 through WLm to inactive low voltage level. The instruction decoder/ controller unit 6 further produces the fourth control signal CNT4 indicative of an extremely high voltage level, and the level-shift unit 2 is responsive to the fourth control signal CNT4 so that the source line S is elevated to the extremely high voltage level. The Fouler-Nordheim tunneling phenomenon takes place between all of the floating gate electrodes and the source line S across the gate oxide films of the n-channel floating gate type field effect transistors M11 through Mmn, and electrons accumulated in the floating gate electrodes are evacuated to the source line S. This results in that the threshold levels are lowered, and all of the n-channel floating gate type field effect transistors M11 through Mmn theoretically enter the erased state.

The erasing operation is immediately followed by a verifying operation. Namely, the instruction decoder/ controller unit 6 shifts the control signals CNT1 and CNT2 indicative of enable state, and the column address decoder unit 7 and the row address decoder unit 8 become responsive to the address signal. For this reason, the column address decoder unit 7 sequentially shifts the decoded signal lines YS1 through YSn to the high voltage level, and allows the column selector unit 3 to couple the digit lines D1 through Dn with the data output unit 4. The instruction decoder/ controller unit 6 further produces the third control signal CNT3 indicative of a first intermediate voltage level lower than the read-out voltage level as well as the fourth control signal CNT4 indicative of the low voltage level. Then, the level-shift unit 9 supplies the first intermediate voltage level to the row address decoder unit 8, and the row address decoder unit 8 sequentially drives the word lines WL1 through WLm to the first intermediate voltage level. The fourth control signal CNT4 causes the level-shift unit 2 to supply the low voltage level to the source line S, and current is sequentially supplied from the data output unit 4 to the memory cells M11 through Mmn assigned the address indicated by the address signal to see whether or not the n-channel floating gate type field effect transistors M11 through Mmn provide conductive channels in the presence of the first intermediate voltage level. If electrons are evacuated from the floating gate electrode of an n-channel floating gate type field effect transistor, a conductive channel takes place in the presence of the first intermediate voltage level, and an input node of the data output unit 4 is decayed. However, if electrons still remain in the floating gate electrode of the n-channel floating gate type field effect transistor, any conductive channel hardly takes place, and the input node of the data output unit 4 is kept in the high voltage level. The data output unit 4 produces an output data signal indicative of the voltage level at the input node thereof, and informs a user of the state of the memory cell. The address signal is sequentially incremented, and all of the memory cells M11 through Mmn are checked through the verifying operation. If at least one of the memory cells M11 to Mmn remains in non-erased state, the erasing operation is repeated, and is followed by the verifying operation again. Thus, the prior art electrically erasable and programmable read only memory device repeats the erasing operation and the verifying operation until all of the memory cells M11 through Mmn enter the erased state. The reason why the write-in operation is repeated is to prevent the memory cells M11 through Mmn from entry into depletion mode or excessively erased state.

When all of the memory cells M11 through Mmn entered the erased state, the prior art electrically erasable and programmable read only memory device can be programmed through a write-in operation followed by another verifying operation. For the write-in operation, the prior art electrically erasable and programmable read only memory device further comprises a data input buffer unit 10 for storing a data bit indicative of either erased or write-in state, an extremely high voltage generating unit 11 for producing an extremely high voltage level, a column address decoder unit 12 responsive to the address signal as well as the data bit for selectively driving decoded signal lines YS11 through YS1n, and a column selector unit 13 coupled between the digit lines D1 through Dn and the extremely high voltage generating unit 11. The column selector unit 13 has a plurality of n-channel enhancement type transfer transistors QN21 through QN2n which are gated by the decoded signal lines YS11 through YS1n. The instruction decoder/ controller unit 6 is further coupled with the input data buffer unit 10 and the column address decoder unit 12, and produces fifth and sixth control signals CNT5 and CNT6.

Assuming now that the address signal is indicative of the memory cell M11 and that the data bit indicative of the write-in state is supplied to the input data buffer unit 10, an instruction command code indicative of the write-in operation causes the instruction decoder/ controller unit 6 to produces the first control signal CNT1 indicative of the disable state, and the column address decoder unit 7 shifts all of the decoded signal lines YS1 through YSn to the inactive low voltage level so that all of the n-channel enhancement type transfer transistors QN11 through QN1n turn off. As a result, the digit lines D1 through Dn are electrically isolated from one another by means of the column selector unit 3. The instruction decoder/ controller unit 6 further produces the third control signal CNT3 indicative of an extremely high write-in voltage level, and the level-shift unit 9 supplies the write-in voltage level as high as, for example, 20 volts to the row address decoder unit 8. However, the second control signal CNT2 is still indicative of the enable state, and the row address decoder unit 8 is responsive to the address signal for driving one of the word lines WL1 through WLm to the extremely high write-in voltage level. The fourth control signal CNT4 is still indicative of the low voltage level, and the level-shift unit 2 supplies the low voltage level or zero volt to the source line S. The fifth control signal CNT5 is indicative of enable state, and the input data buffer unit 10 can latch the data bit indicative of the write-in state. The sixth control signal CNT6 is also indicative of the enable state, and the column address decoder unit 12 is enabled for the address signal.

In this situation, the row address decoder unit 8 drives the word line WL1 to the extremely high write-in voltage level, and the data bit enables the column address decoder unit 12. The enabled column address decoder unit 12 drives the decoded signal line YS21 to the high voltage level, and the n-channel enhancement type transfer transistor QN21 couples the digit line D1 with the extremely high voltage generating unit 11. Then, the extremely high voltage level is applied to the drain node of the n-channel floating gate type field effect transistor M11, and hot electrons are produced at the p-n junction between the drain and the channel region. Since the row address decoder circuit 8 applies the extremely high write-in voltage level to the control gate electrode of the n-channel floating gate type field effect transistor M11, and the hot electrons are attracted to the floating gate electrode. The hot electrons are accumulated in the floating gate electrode of the n-channel floating gate type field effect transistor M11, and the threshold level thereof is theoretically elevated over the read-out voltage level. On the other hand, if the data bit stored in the input data buffer unit 10 is indicative of the erased state, the column address decoder unit 12 ignores the address signal, and all of the decoded signal lines YS11 through YS1n remain in the low voltage level. As a result, all of the digit lines D1 through Dn are isolated from the extremely high voltage level, and the memory cell indicated by the address signal remains in the erased state.

In order to verify the state of the memory cell M11, the verifying operation follows the write-in operation. Namely, the instruction decoder/ controller unit 6 causes the first control signal CNT1 to be indicative of the enable state. However, the sixth control signal CNT6 becomes indicative of the disable state. Then, the column address decoder unit 7 is responsive to the address signal, and drives the decoded signal line YS1 to the high voltage level. The n-channel enhancement type transfer transistor QN11 turns on, and the data output unit 4 supplies current to the digit line D1. Although the second control signal CNT2 is still indicative of the enabled state, the third control signal CNT3 is changed to be indicative of a second intermediate voltage level higher than the read-out voltage level. The level-shift unit 9 supplies the second intermediate voltage level to the row address decoder unit 8, and the row address decoder unit 8 drives the word line WL1 to the second intermediate voltage level. If the threshold voltage level of the n-channel floating gate type field effect transistor M11 is sufficiently elevated over the read-out voltage level, the n-channel floating gate type field effect transistor M11 remains off, and the write-in state is verified with the output data signal. However, if the threshold voltage level still remains below the second intermediate voltage level, the data output unit 4 informs the user of the erased state of the memory cell M11, and the write-in operation is repeated again. Thus, the electrically erasable and programmable read only memory device repeats the write-in operation and the verifying operation until the memory cell enters the write-in state.

However, a problem is encountered in the prior art electrically erasable and programmable read only memory device in that a relatively long time period is consumed by the erasing operation. This is because of the fact that the memory cells M11 through Mmn stepwise enter the erased state through repetition of the erasing operation followed by the verifying operation. On the other hand, if the erasing operation is prolonged, most of the memory cells may enter the erased state through a single erasing operation. However, some n-channel floating gate type field effect transistors are changed to the depletion mode transistor, and the write-in operation hardly recovers these memory cells therefrom.

SUMMARY OF THE INVENTION

It is therefore an important object of the present invention to provide a non-volatile semiconductor memory device which can shrink the time period consumed by the erasing operation.

To accomplish the object, the present invention proposes to prolong an erasing operation over a time period previously written therein.

In accordance with the present invention, there is provided a semiconductor non-volatile memory device fabricated on a single semiconductor chip and having at least an erasing mode, a write-in mode and a read-out mode of operation, comprising: a) a plurality of memory cells for storing electrically erasable data bits; b) a timer means for storing an interval data indicative of a time period, and producing an enable signal until the time period is expired; and c) an erasing means responsive to an external instruction code indicative of an erasing mode of operation, and enabled with the enable signal for erasing the electrically erasable data bits stored in the plurality of memory cells.

BRIEF DESCRIPTION OF THE DRAWINGS

The features and advantages of the semiconductor non-volatile memory device according to the present invention will be more clearly understood from the following description taken in conjunction with the accompanying drawings in which.

DESCRIPTION OF THE PREFERRED EMBODIMENTS

First Embodiment

Figure 1:
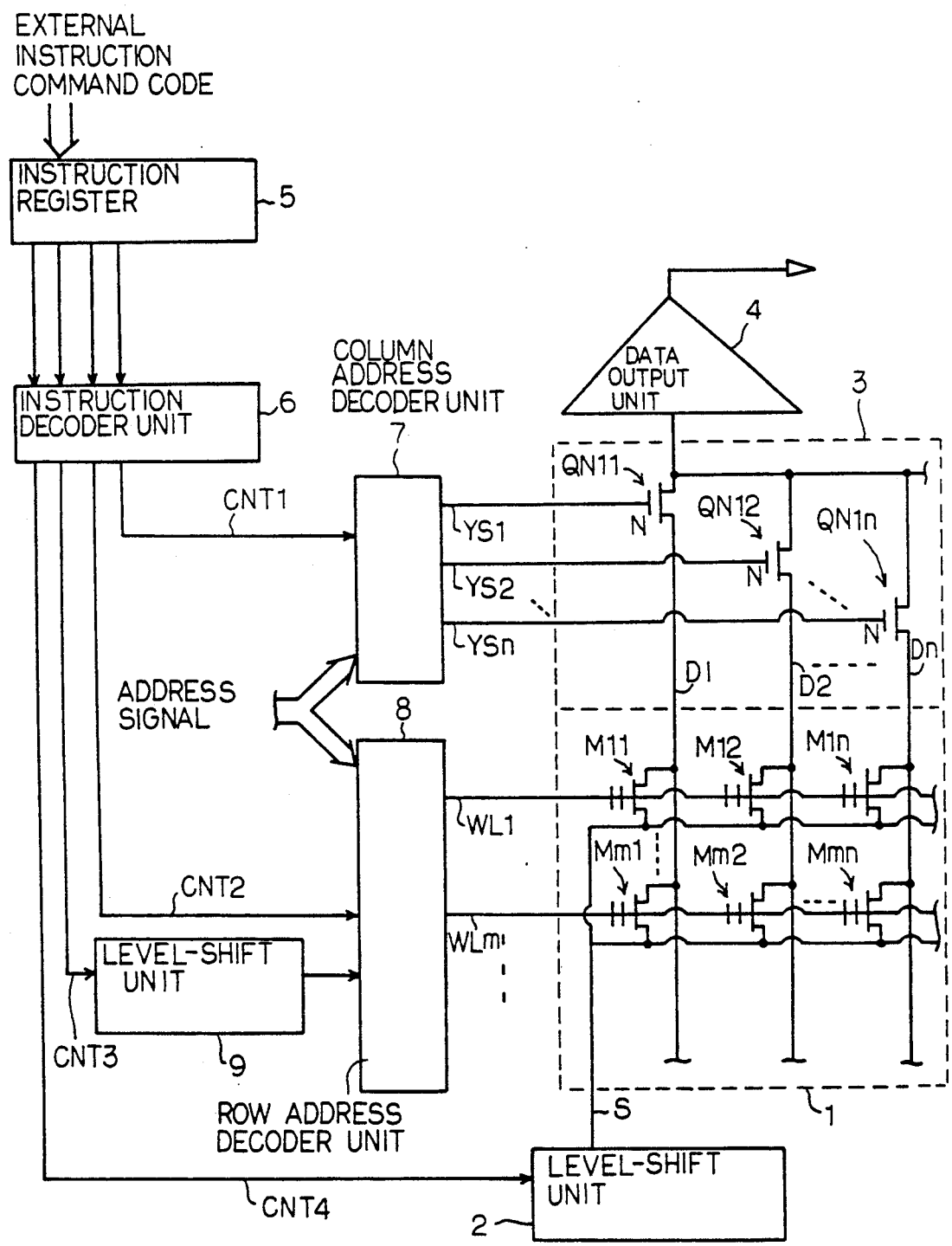
FIG. 1 is a block diagram showing the circuit arrangement of a prior art electrically erasable and programmable read only memory (EEPROM) device used for the erasing operation.
Figure 2:
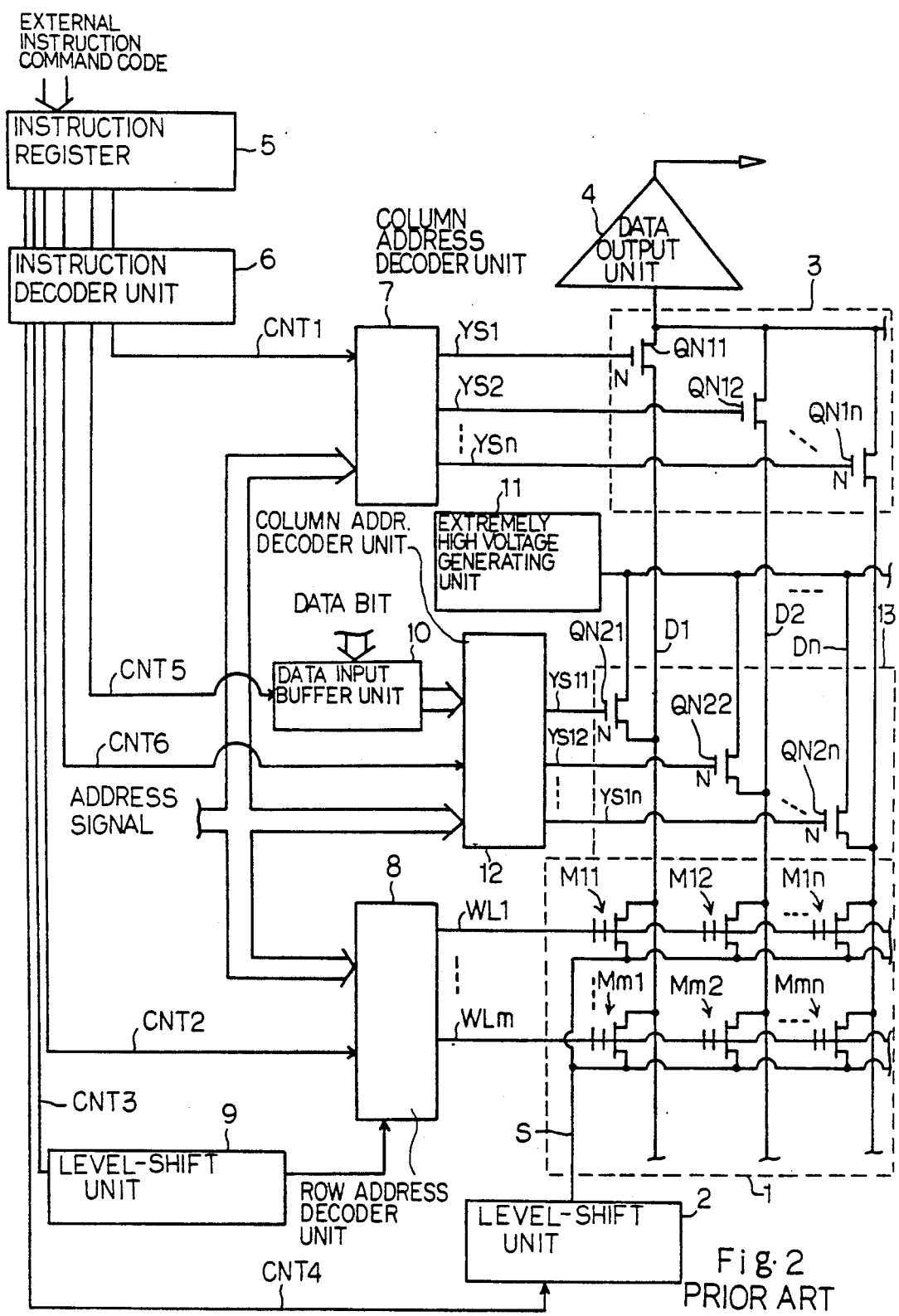
FIG. 2 is a block diagram showing the circuit arrangement of a prior art electrically erasable and programmable read only memory device used for the write-in operation.
Figure 3:
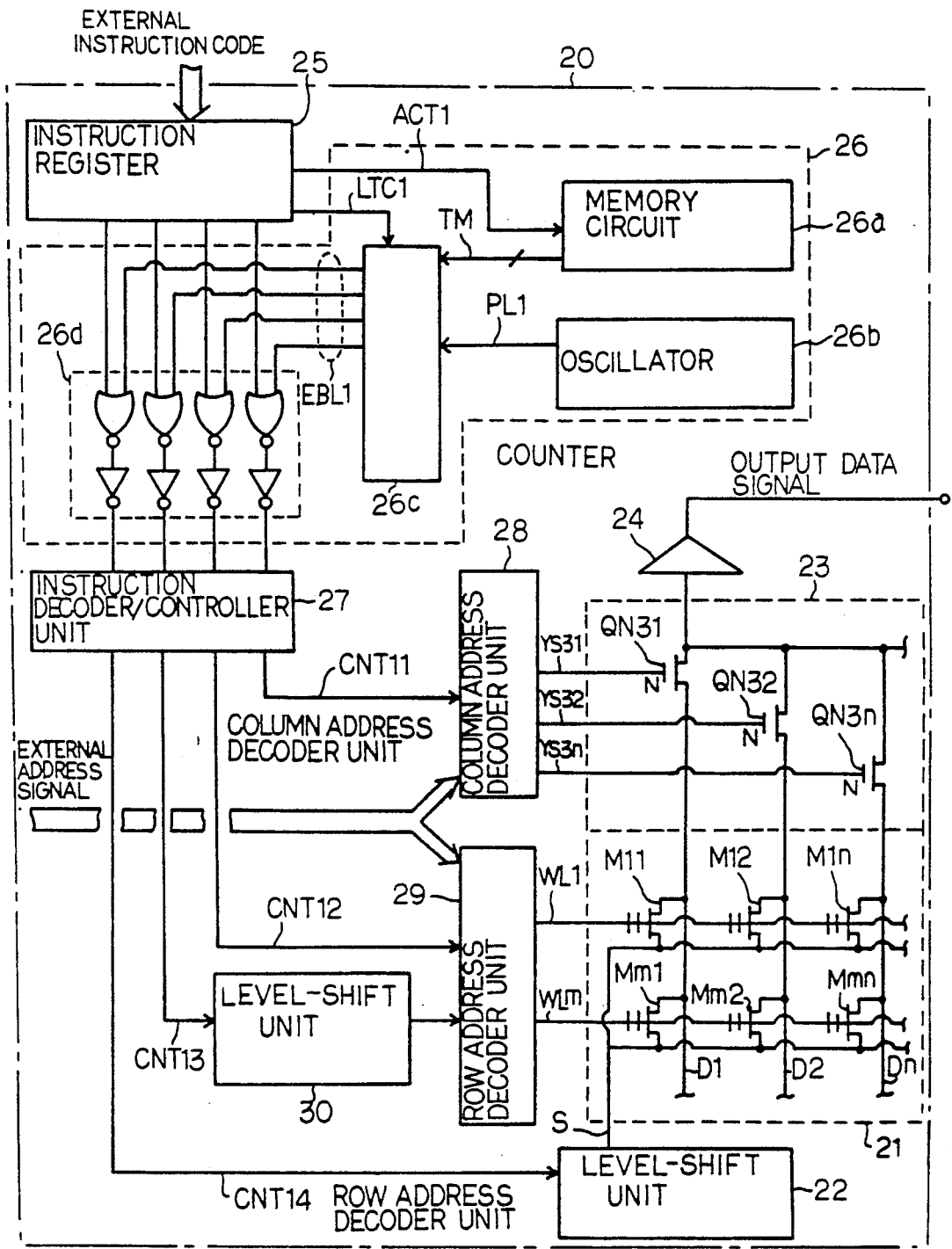
FIG. 3 is a block diagram showing the circuit arrangement of an electrically erasable and programmable read only memory device used for an erasing operation in accordance with the present invention.

Referring to FIG. 3 of the drawings, an electrically erasable and programmable read only memory device embodying the present invention is fabricated on a single semiconductor chip 20. FIG. 3 illustrates component circuits used in an erasing mode of operation. Although the electrically erasable and programmable read only memory device further comprises other component circuits used for a write-in mode of operation, they are deleted from the circuit arrangement shown in FIG. 3 for the sake of simplicity.

The electrically erasable and programmable read only memory device has a memory cell array 21 which is formed by a plurality of memory cells M11, M12, M1n, Mm1, Mm2 and Mmn arranged in rows and columns, and each of the memory cells M11 through Mmn is of the n-channel floating gate type field effect transistor. The n-channel floating gate type field effect transistors are referred to with the same references as the memory cells M11 through Mmn. A plurality of word lines WL1 through WLm are respectively associated with the rows of the memory cell array 21, and are coupled with the control gates of the associated n-channel floating gate type field effect transistors M11 through Mmn. A plurality of digit lines D1, D2 and Dn are associated with the columns of the memory cell array 21, and are coupled with the drain nodes of the associated n-channel floating gate type field effect transistors M11 through Mmn. A source line S is shared between all of the memory cells M11 through Mmn, and is coupled between the source nodes of the floating gate type field effect transistors M11 through Mmn and a level-shift unit 22. The digit lines D1 through Dn are further coupled with a column selector unit 23 which in turn is coupled with a data output unit 24. The column selector unit 23 has a plurality of n-channel enhancement type transfer transistors QN31, QN32 and QN3n, and the n-channel enhancement type transfer transistors QN31 through QN3n selectively couple the associated digit lines D1 through Dn with the data output unit 24.

The electrically erasable and programmable read only memory device according to the present invention further comprises an instruction register 25, and an external instruction code is stored therein. The instruction register 25 is coupled with a controlling unit 26 which in turn is coupled with an instruction decoder/controller unit 27. The controlling unit 26 comprises a memory circuit 26a, an oscillator 26b, a counter 26c and a switching array 26d. The memory circuit 26a stores interval data indicative of a time period consumed in an erasing mode of operation until all of the memory cells M11 to Mmn enter the erased state. In this instance, the memory circuit 26a is implemented by an electrically programmable read only memory cell array. However, any non-volatile memory circuit programmable after an inspection sequence may be available, and a fuse ROM and conductive strip array breakable with laser beam are examples of such an non-volatile memory circuit. The memory circuit 26a is responsive to an activation signal ACT1 produced from an external instruction code indicative of the erasing operation, and the memory circuit 26a supplies an interval data signal TM indicative of the time period. The oscillator 26b produces a pulse train PL1, and the interval data signal TM and the pulse train PL1 are supplied to the counter 26c. The counter 26c is responsive to a latch signal LTC1, and the interval data signal TM is loaded to the counter 26c. The value indicated by the interval data signal TM is decremented with the pulse train PL1, and the counter 26c supplies a multi-bit enable signal EBL1 of active low level to the switching circuit 26d. The switching circuit 26d comprises a parallel combination of NOR gates and a parallel combination of inverters, and the NOR gates are simultaneously enabled with the multi-bit enable signal EBL1. While the NOR gates are enabled, the external instruction code is transferred from the instruction register 25 to the inverters, and the inverters relays the external instruction code to the instruction decoder/ controller unit 27. While the external instruction code is applied to the instruction decoder/ controller unit 27, the instruction decoder/ controller unit 27 prolongs a single erasing operation, and all of the memory cells M11 through Mmn are erased through the prolonged single erasing operation.

The instruction decoder/ controller unit 27 in turn is coupled with a column address decoder unit 28, a row address decoder unit 29 and a level-shift unit 30, and produces first, second, third and fourth control signals CNT1, CNT2, CNT3 and CNT4. An address signal is further supplied to the column address decoder unit 28 and the row address decoder unit 29, and the column address decoder unit 28 and the row address decoder unit 29 respectively drive decoded signal lines YS31, YS32 and YS3n and the word lines WL1 through WLm. The first to third control signals will hereinbelow be described in connection with the operations of the electrically erasable and programmable read only memory device according to the present invention.

The electrically erasable and programmable read only memory device according to the present invention selectively enters an inspection mode of operation, the erasing mode of operation, the write-in mode of operation and a read-out mode of operation, and the erasing operation contains a first erasing phase, a second erasing phase and a first verifying phase of operation. Both of the first and second erasing phases of operation are automatically followed by the first verifying phase of operation. In the first erasing phase, an extremely high voltage level is continuously applied to the source line S for evacuating electrons from the floating gate electrodes until the time period indicated by the interval data is expired. However, the second erasing phase is similar to the erasing operation of the prior art electrically erasable and programmable read only memory device, is repeated until the erased state is verified through the first verifying phase for all of the memory cells M11 through Mmn.

When the electrically erasable and programmable read only memory device according to the present invention is completed through a fabrication process, inspection sequences are carried out before delivery from the factory, and one of the inspection sequences determines the time period for the interval data. In the inspection sequence, the second erasing phase followed by the first verifying phase is repeated until the erased state is verified for all of the memory cells M11 through Mmn, and the interval data is produced on the basis of the number of the second erasing phases carried out in the inspection sequence. The interval data is stored in the memory circuit 26a.

After the delivery from the factory, the electrically erasable and programmable read only memory device may enter the erasing mode of operation. Namely, an external instruction command code indicative of the erasing mode of operation is supplied to the instruction register 25, and the interval data is read out from the memory circuit 26a to the counter 26c. The counter 26c is responsive to the latch signal LTC1, and the interval data is loaded to the counter 26c. Then, the counter 26c shifts the multi-bit enable signal EBL1 to the active low level, and the pulse train PL1 causes the counter 26c to decrement the value indicated by the interval data. While the counter 26c decrements the value, the external instruction code is relayed through the switching array 26d to the instruction decoder/ controller unit 27, and the instruction decoder/ controller unit 27 produces the first and second control signals CNT11 and CNT12 indicative of disable state, and the column address decoder unit 28 and the row address decoder unit 29 ignores the address signal. In this situation, the column address decoder unit 28 causes all of the n-channel enhancement type transfer transistors QN31 through QN3n to turn off, and the row address decoder unit 29 shifts all of the word lines WL1 through WLm to inactive low voltage level. The instruction decoder/ controller unit 27 further produces the fourth control signal CNT14 indicative of an extremely high voltage level, and the level-shift unit 22 is responsive to the fourth control signal CNT14 so that the source line S is elevated to the extremely high voltage level. The Fouler-Nordheim tunneling phenomenon takes place between all of the floating gate electrodes and the source line S across the gate oxide films of the n-channel floating gate type field effect transistors M11 through Mmn, and is continued until the value is decremented to zero. Then, electrons accumulated in the floating gate electrodes are evacuated to the source line S, and all of the n-channel floating gate type field effect transistors M11 through Mmn enter the erased state. This means that the threshold levels are lowered below a read out voltage level.

The first erasing phase of operation is immediately followed by a first verifying phase of operation. Namely, the instruction decoder/ controller unit 27 shifts the control signals CNT11 and CNT12 indicative of enable state, and the column address decoder unit 28 and the row address decoder unit 29 become responsive to the address signal. For this reason, the column address decoder unit 28 sequentially shifts the decoded signal lines YS31 through YS3n to the high voltage level, and allows the column selector unit 23 to sequentially couple the digit lines D1 through Dn with the data output unit 4. The instruction decoder/ controller unit 27 further produces the third control signal CNT13 indicative of a first intermediate voltage level lower than the read-out voltage level as well as the fourth control signal CNT14 indicative of the low voltage level. Then, the level-shift unit 30 supplies the first intermediate voltage level to the row address decoder unit 29, and the row address decoder unit 29 sequentially drives the word lines WL1 through WLm to the first intermediate voltage level. As a result, the memory cells M11 through Mmn are sequentially coupled with the data output unit 24. The fourth control signal CNT14 causes the level-shift unit 22 to supply the low voltage level to the source line S, and current is sequentially supplied from the data output unit 24 to the memory cells M11 through Mmn assigned the address indicated by the address signal to see whether or not the n-channel floating gate type field effect transistors M11 through Mmn provide conductive channels in the presence of the first intermediate voltage level. If electrons are sufficiently evacuated from the floating gate electrode of an n-channel floating gate type field effect transistor, a conductive channel takes place in the presence of the first intermediate voltage level, and an input node of the data output unit 24 is decayed. However, if a substantial amount of electrons still remain in the floating gate electrode of the n-channel floating gate type field effect transistor, any conductive channel hardly takes place, and the input node of the data output unit 24 is kept in the high voltage level. The data output unit 24 produces an output data signal indicative of the voltage level at the input node thereof, and informs a user of the state of the memory cell. The address signal is sequentially incremented, and all of the memory cells M11 through Mmn are checked through the first verifying phase of operation. As described hereinbefore, the first erasing phase of operation is expected to sufficiently evacuate the electrons stored in the floating gate electrodes. However, if any one of the memory cells unfortunately remains in the non-erased state, the second erasing phase of operation followed by the first verifying phase is carried out, and is repeated if necessary. Since the second erasing phase of operation is continued over relatively short time period rather than the first erasing phase of operation, the n-channel floating gate type field effect transistors M11 through Mmn hardly enter depletion mode.

When all of the memory cells M11 through Mmn entered the erased state, the electrically erasable and programmable read only memory device can be programmed through the write-in mode of operation, and data bits selectively written into the memory cells M11 through Mmn are accessible in the read out mode of operation. However, no further description is incorporated hereinbelow, because these modes of operation are similar to those of the prior art electrically erasable and programmable read only memory device.

Figure 4:
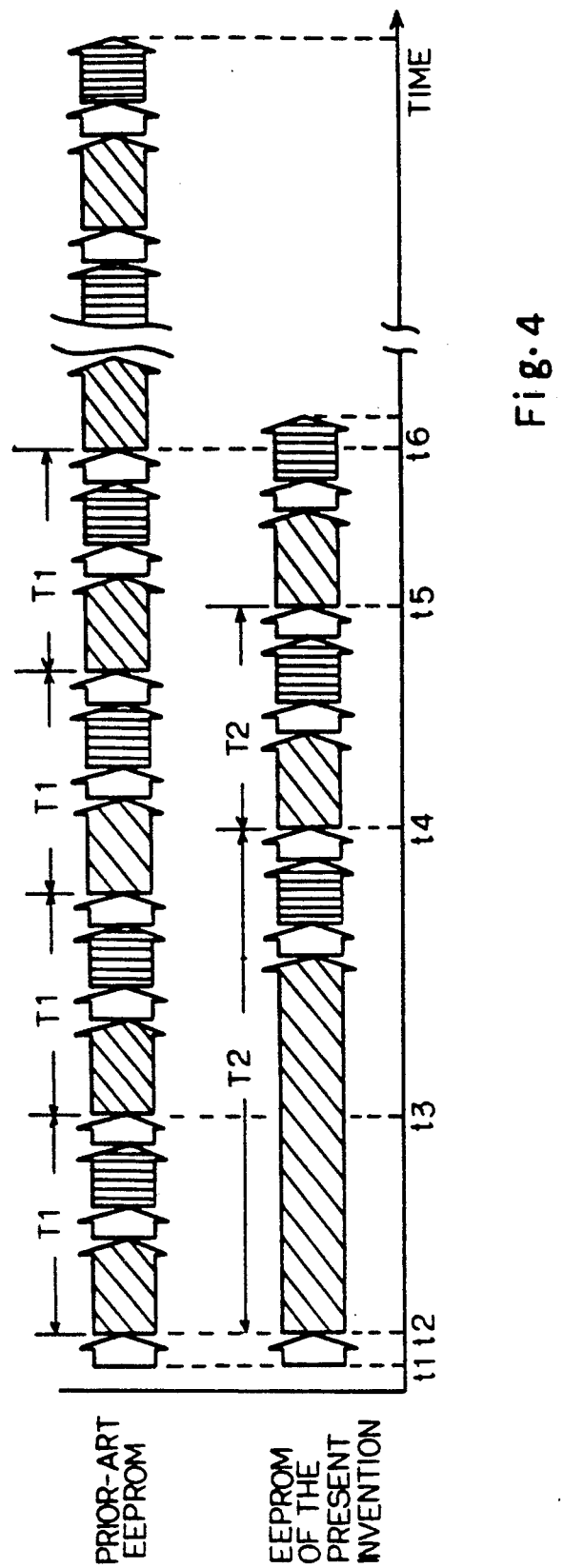
FIG. 4 is a diagram showing the erasing modes of operation carried out by the prior art electrically erasable and programmable read only memory device as well as by the electrically erasable and programmable read only memory device according to the present invention.

FIG. 4 illustrates the advantage of the present invention, and an arrow without any hatch, an arrow with hatching and an arrow with vertical lines are respectively indicative of a phase shifting period, an erasing period and a verifying period. The second erasing phase consumes a single erasing period, two phase shifting periods and a single verifying period, and the total time period for the second erasing phase is labeled with T1. On the other hand, the first erasing phase also consumes a single erasing period, two phase shifting periods and a single verifying period, and the total time period is labeled with T2. Since the erasing period of the first erasing phase is about four times longer than the erasing period of the second erasing phase in this instance, the time interval between time t2 and time t4 is equivalent to the time interval between time t2 and time t6. In other words, the first erasing phase achieves the same erasing effect without six phase shifting periods and three verifying periods, and the erasing mode of operation is shrunk by the total time periods thereof.

In an actual prior art electrically erasable and programmable read only memory device repeats the second erasing phase twenty times. The phase shift period and the verifying period consume about 10 microseconds and 50 milliseconds, and the erasing period of the second erasing phase consumes 10 milliseconds. Therefore, 1200.4 milliseconds are consumed by the prior art electrically erasable and programmable read only memory device until all of the memory cells M11 through Mmn are erased. However, if the first erasing phase and the verifying phase are carried out and the second erasing phase and the verifying phase follows, the total time period TP is calculated as $$TP = (10 \text{ msec.} \times 20 + 50 \text{ msec.} \times 3 + 10 \text{ microsec.} \times 6)$$
$$= 350.06 \text{ millisecond.}$$

Comparing the total time period TP with that of the prior art, the advantage of the present invention will be understood.

Second Embodiment

Figure 5:
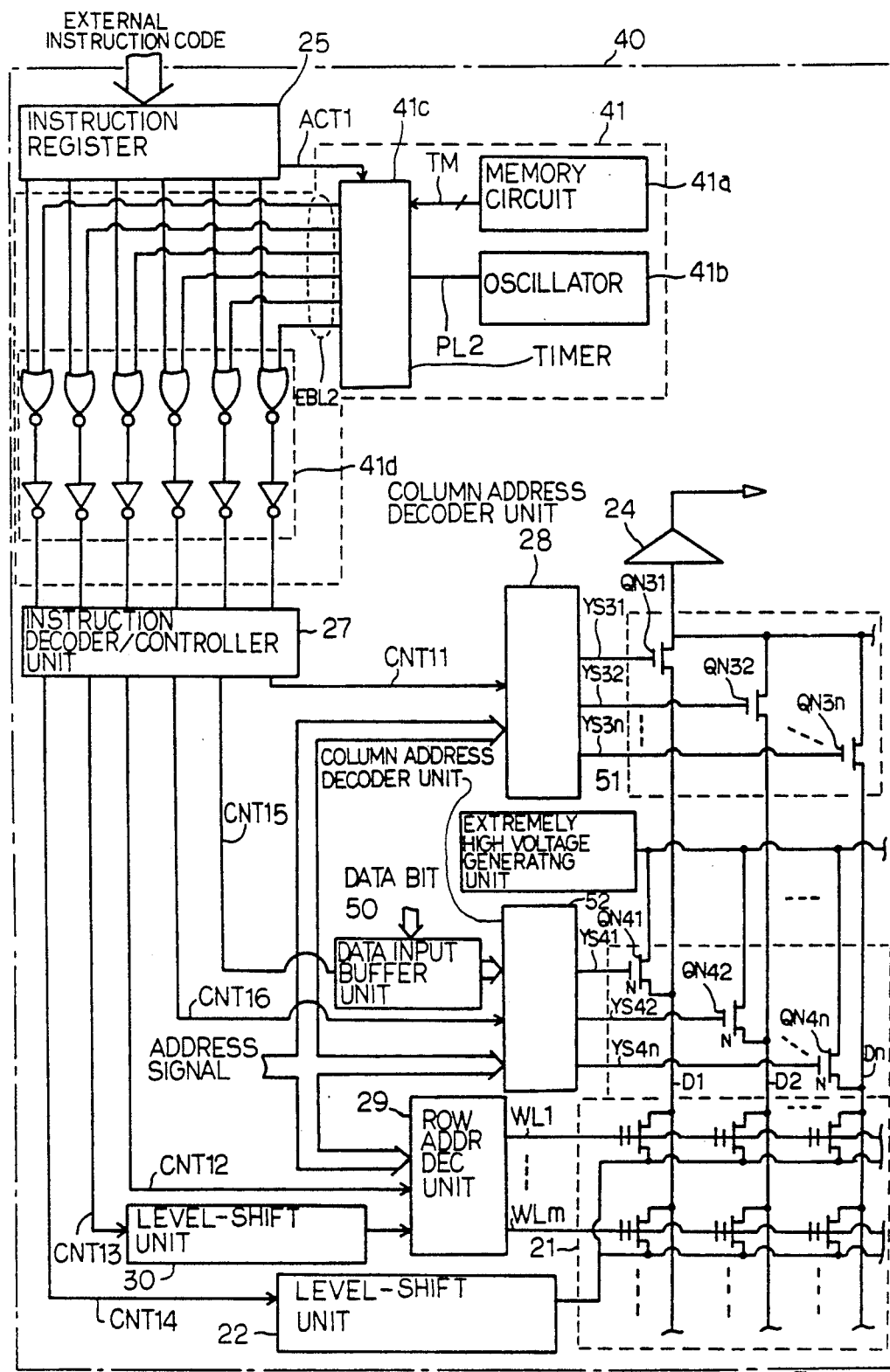
FIG. 5 is a block diagram showing the circuit arrangement of the electrically erasable and programmable read only memory device used for a write-in operation in accordance with the present invention.

Turning to FIG. 5 of the drawings, another electrically erasable and programmable read only memory device is fabricated on a single semiconductor chip 40, and not only component circuits for the erasing mode but also component circuits for the write-in mode are illustrated. The component circuits for the erasing mode are similar to those of the first embodiment, and are labeled with the same references as those of the first embodiment without detailed description. A controlling unit 41 is newly added, and comprises a memory circuit 41a, an oscillator 41b, a timer 41c and a switching array 41d. The memory circuit 41a stores interval data indicative of a time period consumed in an erasing mode of operation until all of the memory cells M11 to Mmn enter the erased state, and the memory circuit 41a supplies an interval data signal TM indicative of the time period. The oscillator 41b produces a pulse train PL2, and the interval data signal TM and the pulse train PL2 are supplied to the timer 41c. The timer 41c is responsive to an activation signal ACT1, and shifts a multi-bit enable signal EBL2 to active low level. The timer 41c counts the number of the pulses on the pulse train PL2, and compares the number of the pulses with the value indicated by the interval data signal TM. While the number of pulses is smaller than the value, the timer 41c keeps the multi-bit enable signal EBL2 in the active low level. However, when the number of the pulses reaches the value, the timer 41c shifts the multi-bit enable signal EBL2 to inactive high level. The switching circuit 41d comprises a parallel combination of NOR gates and a parallel combination of inverters, and the NOR gates are simultaneously enabled with the multi-bit enable signal EBL2. While the NOR gates are enabled, the external instruction code is transferred from the instruction register 25 to the inverters, and the inverters relays the external instruction code to the instruction decoder/controller unit 27. While the external instruction code is applied to the instruction decoder/controller unit 27, the instruction decoder/controller unit 27 prolongs a single erasing operation, and all of the memory cells M11 to Mmn are erased through the prolonged single erasing operation.

For the write-in operation, the electrically erasable and programmable read only memory device further comprises a data input buffer unit 50 for storing a data bit indicative of either erased or write-in state, an extremely high voltage generating unit 51 for producing an extremely high voltage level, a column address decoder unit 52 responsive to the address signal as well as the data bit for selectively driving decoded signal lines YS41 through YS4n, and a column selector unit 53 coupled between the digit lines D1 through Dn and the extremely high voltage generating unit 51. The column selector unit 53 has a plurality of n-channel enhancement type transfer transistors QN41 through QN4n which are gated by the decoded signal lines YS41 through YS4n. The instruction decoder/controller unit 27 is further coupled with the data input buffer unit 50 and the column address decoder unit 52, and produces fifth and sixth control signals CNT15 and CNT16.

Description is hereinbelow made on circuit behavior of the electrically erasable and programmable read only memory device. However, the erasing mode of operation is similar to that of the first embodiment, and no further description is incorporated hereinbelow. The description is focused on the write-in mode of operation only.

Assuming now that the address signal is indicative of the memory cell M11 and that the data bit indicative of the write-in state is supplied to the data input buffer unit 50, an instruction code indicative of the write-in operation causes the instruction decoder/controller unit 27 to produces the first control signal CNT11 indicative of the disable state, and the column address decoder unit 28 shifts all of the decoded signal lines YS31 through YS3n to the inactive low voltage level so that all of the n-channel enhancement type transfer transistors QN31 through QN3n turn off. The instruction decoder/controller unit 27 further produces the third control signal CNT13 indicative of an extremely high write-in voltage level, and the level-shift unit 30 supplies the write-in voltage level as high as, for example, 20 volts to the row address decoder unit 29. However, the second control signal CNT12 is indicative of the enable state, and the row address decoder unit 29 is responsive to the address signal for driving one of the word lines WL1 through WLm to the extremely high write-in voltage level. The fourth control signal CNT14 is still indicative of the low voltage level, and the level-shift unit 22 supplies the low voltage level or zero volt to the source line S. The fifth control signal CNT15 is indicative of enable state, and the data input buffer unit 50 can latch the data bit indicative of the write-in state. The sixth control signal CNT16 is also indicative of the enable state, and the column address decoder unit 52 is enabled for the address signal.

In this situation, the row address decoder unit 29 drives the word line WL1 to the extremely high write-in voltage level, and the data bit enables the column address decoder unit 52. The enabled column address decoder unit 52 drives the decoded signal line YS41 to the high voltage level, and the n-channel enhancement type transfer transistor QN41 couples the digit line D1 with the extremely high voltage generating unit 51. Then, the extremely high voltage level is applied to the drain node of the n-channel floating gate type field effect transistor M11, and hot electrons are produced at the p-n junction between the drain and the channel region. Since the row address decoder circuit 29 applies the extremely high write-in voltage level to the control gate electrode of the n-channel floating gate type field effect transistor M11, and the hot electrons are attracted to the floating gate electrode. The hot electrons are accumulated in the floating gate electrode of the n-channel floating gate type field effect transistor M11, and the threshold level thereof is theoretically elevated over the read-out voltage level. On the other hand, if the data bit stored in the data input buffer unit 50 is indicative of the erased state, the column address decoder unit 52 ignores the address signal, and all of the decoded signal lines YS31 through YS3n remain in the low voltage level. As a result, all of the digit lines D1 through Dn are isolated from the extremely high voltage level, and the memory cell indicated by the address signal remains in the erased state.

In order to verify the state of the memory cell M11, the verifying operation follows the write-in operation. Namely, the instruction decoder/controller unit 27 causes the first control signal CNT11 to be indicative of the enable state. However, the sixth control signal CNT16 becomes indicative of the disable state. Then, the column address decoder unit 28 is responsive to the address signal, and drives the decoded signal line YS31 to the high voltage level. The n-channel enhancement type transfer transistor QN31 turns on, and the data output unit 24 supplies current to the digit line D1. The second control signal CNT12 is still indicative of the enabled state, the third control signal CNT13 is changed to be indicative of a second intermediate voltage level higher than the read-out voltage level. The level-shift unit 30 supplies the second intermediate voltage level to the row address decoder unit 29, and the row address decoder unit 29 drives the word line WL1 to the second intermediate voltage level. If the threshold voltage level of the n-channel floating gate type field effect transistor M11 is sufficiently elevated over the read-out voltage level, the n-channel floating gate type field effect transistor M11 remains off, and the write-in state is verified with the output data signal. However, if the threshold voltage level still remains below the second intermediate voltage level, the data output unit 24 informs the user of the erased state of the memory cell M11, and the write-in operation is repeated again.

Although particular embodiments of the present invention have been shown and described, it will be obvious to those skilled in the art that various changes and modifications may be made without departing from the spirit and scope of the present invention. For example, the electrically erasable and programmable read only memory device may be incorporated in an ultra large scale integration as one of the component circuits.

What is claimed is:

1. A semiconductor non-volatile memory device fabricated on a single semiconductor chip and having at least an erasing mode, a write-in mode and a read-out mode of operation, comprising:
   a) a plurality of memory cells for storing electrically erasable data bits;
   b) a timer means for storing an interval data indicative of a time period determined through an inspection sequence for said plurality of memory cells for appropriately allowing most of said plurality of memory cells to enter an erased state, and producing an enable signal until said time period is expired; and
   c) an erasing means responsive to an external instruction code indicative of an erasing mode of operation, and enabled with said enable signal for erasing said electrically erasable data bits stored in said plurality of memory cells, thereby causing most of said plurality of memory cells to enter said erased state.

2. A semiconductor non-volatile memory device as set forth in claim 1, in which said plurality of memory cells are formed by floating gate type field effect transistors, respectively.

3. A semiconductor non-volatile memory device as set forth in claim 1, in which said timer means comprises b-1) a memory circuit for storing said interval data in a non-volatile manner, b-2) an oscillator for producing a pulse train, b-3) a counter loaded with a value indicated by said interval data, and producing an enable signal until the number of pulses on said pulse train is equal to the value indicated by said interval data, and b-4) a switching circuit enabled by said enable signal, and transferring said external instruction code from an instruction register to said erasing means.

4. A semiconductor non-volatile memory device as set forth in claim 1, in which said erasing means comprises c-1) an instruction decoder and controller circuit responsive to said external instruction code for producing at least first, second, third and fourth control signals, c-2) a column address decoder unit disabled with said first control signal in said erasing mode for causing the columns of said plurality of memory cells to be electrically isolated from one another, c-3) a row address decoder unit disabled with said second control signal in said erasing mode for shifting word lines respectively coupled with the rows of said plurality of memory cells to inactive level, c-4) a first level-shift unit responsive to said third control signal for supplying said inactive level to said row address decoder unit, and c-5) a second level-shift unit responsive to said fourth control signal for supplying an extremely high voltage level to source nodes of said plurality of memory cells for evacuating electrons from floating gate electrodes of said plurality of memory cells.

5. A semiconductor non-volatile memory device as set forth in claim 4, in which said erasing mode of operation has a first erasing phase for evacuating said electrons over said time period indicated by said interval data, a first verifying phase carried out after said first erasing phase for checking said plurality of memory cells to see whether or not said plurality of memory cells enter erased state, a second erasing phase carried out after said first verifying phase over a predetermined time period shorter than said time period when at least one of said plurality of memory cells remains in non-erased state, and a second verifying phase carried out after said second erasing phase to see whether or not said at least one of said plurality of memory cells enters the erased state.

* * * * *